US011441970B2

(12) United States Patent
Ehrmann et al.

(10) Patent No.: US 11,441,970 B2
(45) Date of Patent: Sep. 13, 2022

(54) MEASUREMENT APPARATUS FOR MEASURING A WAVEFRONT ABERRATION OF AN IMAGING OPTICAL SYSTEM

(71) Applicant: Carl Zeiss SMT GmbH, Oberkochen (DE)

(72) Inventors: Albrecht Ehrmann, Aalen (DE); Helmut Haidner, Aalen (DE); Michael Samaniego, Oberkochen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 103 days.

(21) Appl. No.: 16/556,918

(22) Filed: Aug. 30, 2019

(65) Prior Publication Data
US 2020/0003655 A1 Jan. 2, 2020

Related U.S. Application Data

(63) Continuation of application No. PCT/EP2018/025052, filed on Feb. 28, 2018.

(30) Foreign Application Priority Data

Mar. 2, 2017 (DE) .................... 10 2017 203 376.2

(51) Int. Cl.
*G01M 11/02* (2006.01)
*G02B 27/00* (2006.01)
*G03F 7/20* (2006.01)

(52) U.S. Cl.
CPC ..... *G01M 11/0271* (2013.01); *G02B 27/0025* (2013.01); *G03F 7/706* (2013.01); *G03F 7/70133* (2013.01)

(58) Field of Classification Search
CPC ........... G01M 11/0271; G01M 11/005; G01M 11/0264; G03F 7/706; G03F 7/70133;
(Continued)

(56) References Cited

U.S. PATENT DOCUMENTS 6,650,399 B2   11/2003  Baselmans et al.
6,833,906 B1 * 12/2004  Ohsaki ............... G03F 7/706
                                                355/53
(Continued)

FOREIGN PATENT DOCUMENTS

DE          10109929 A1   11/2001
DE      102005021151 A1   12/2005
(Continued)

OTHER PUBLICATIONS

International Search Report, PCT/EP2018/025052, dated Jun. 18, 2018, 4 pages.
(Continued)

*Primary Examiner* — Tri T Ton
(74) *Attorney, Agent, or Firm* — Edell, Shapiro & Finnan, LLC

(57) ABSTRACT

A measurement apparatus (10) for measuring a wavefront aberration of an imaging optical system (12) includes (i) a measurement wave generating module (24) which generates a measurement wave (26) radiated onto the optical system and which includes an illumination system (30) illuminating a mask plane (14) with an illumination radiation (32), as well as coherence structures (36) arranged in the mask plane, and (ii) a wavefront measurement module (28) which measures the measurement wave after passing through the optical system and determines from the measurement result, with an evaluation device (46), a deviation of the wavefront of the measurement wave from a desired wavefront. The evaluation device (46) determines an influence of an intensity distribution (70) of the illumination radiation in the region of the mask plane on the measurement result and, when determining the deviation of the wavefront, utilizes the influence of the intensity distribution.

21 Claims, 4 Drawing Sheets

(58) Field of Classification Search
CPC ............... G02B 27/0025; G02B 6/005; B32B 2457/202; C09K 11/02; C09K 11/565; C09K 11/70; C09K 11/883; C09K 2323/03; C09K 2323/05; G02F 1/133514; G02F 1/133519; G02F 1/1336; G02F 1/133614; G02F 1/133617; G02F 2202/102; G02F 2202/107; G02F 2202/108
USPC .................................................. 356/450–521
See application file for complete search history.

(56) References Cited

U.S. PATENT DOCUMENTS

| | | |
|---|---|---|
| 6,940,587 B2 | 9/2005 | Van Der Laan et al. |
| 2002/0001088 A1 | 1/2002 | Wegmann et al. |
| 2002/0122162 A1* | 9/2002 | Nakauchi ............... G03B 27/68 355/52 |
| 2006/0044536 A1* | 3/2006 | Ohsaki .................... G03F 7/706 355/52 |
| 2006/0071160 A1* | 4/2006 | Haase ..................... H01J 49/164 250/288 |
| 2006/0007429 A1 | 12/2006 | Emer et al. |
| 2010/0302523 A1* | 12/2010 | Shiraishi ................. G03F 7/706 355/67 |
| 2016/0202118 A1 | 7/2016 | Ehrmann et al. |

FOREIGN PATENT DOCUMENTS

| | | |
|---|---|---|
| DE | 102005041373 A1 | 6/2006 |
| DE | 102007054683 A1 | 5/2009 |
| DE | 102008002247 A1 | 12/2009 |
| DE | 102013218991 A1 | 3/2015 |

OTHER PUBLICATIONS

International Preliminary Report and the Written Opinion, PCT/EP2018/025052, dated Sep. 3, 2019, 8 pages.
Partial English Translation of International Search Report, 1 page.

* cited by examiner

MEASUREMENT APPARATUS FOR MEASURING A WAVEFRONT ABERRATION OF AN IMAGING OPTICAL SYSTEM

CROSS REFERENCE TO RELATED APPLICATIONS

This is a Continuation of International Application PCT/EP2018/025052, which has an international filing date of Feb. 28, 2018, and the disclosure of which is incorporated in its entirety into the present Continuation by reference. In addition, the present Continuation claims the benefit of and priority to German patent application 10 2017 203 376.2, filed Mar. 2, 2017. The entire content and disclosure of this German patent application is also incorporated by reference into the present Continuation.

FIELD OF THE INVENTION

The invention relates to a measurement apparatus and to a method for measuring a wavefront aberration of an imaging optical system and to a microlithographic projection exposure apparatus comprising such a measurement apparatus.

BACKGROUND

By way of example, shearing interferometry is used for the highly accurate measurement of optical imaging systems, such as a microlithographic projection lens, for instance. Shearing interferometry is a phase-shifting interferometry technique. For the purposes of determining a wavefront aberration of an optical imaging system, a coherence mask is, for example, arranged in the object plane and a phase-shifting structure, such as e.g. a displaceable diffraction grating, also referred to as analysis grating below, is arranged in the image plane. The analysis grating is displaced transversely to the optical axis of the imaging system in small steps. The spatial derivative of the wavefront in the movement direction of the analysis grating and, therefrom, the topography of the wavefront and, ultimately, a wavefront aberration of the optical imaging system can be determined from the interference patterns or shearograms that were captured by the detector.

DE 101 09 929 A1 describes various measurement apparatuses for determining a wavefront in optical systems, said measurement apparatuses being based on shearing interferometry. In addition to the use of perforated masks with different two-dimensional aperture patterns as a coherence mask in the object plane of an imaging optical system, measurement apparatuses with a simultaneous generation of, in each case, a measurement beam for different field points of the object plane are also presented.

Problems with the measurement apparatuses described reside in a limited measurement accuracy with regard to distortion aberrations, which, when describing the wavefront aberrations using Zernike polynomial expansion, are designated by the field-point-dependent Zernike coefficients Z2 and Z3 characterizing the wavefront tilt.

SUMMARY

It is an object of the invention to provide a measurement apparatus and a method of the type mentioned in the introduction with which the problems mentioned above are addressed or resolved and, in particular, an improvement in the measurement accuracy of distortion aberrations is brought about.

According to one formulation of the invention, the object mentioned above is achieved with a measurement apparatus for measuring a wavefront aberration of an imaging optical system. The measurement apparatus comprises a measurement wave generating module configured to generate a measurement wave for radiating onto the optical system, and comprising an illumination system for illuminating a mask plane with an illumination radiation, and comprising coherence structures arranged in the mask plane. Furthermore, the measurement apparatus comprises a wavefront measurement module configured to measure the measurement wave after passing through the optical system and, with an evaluation device, to determine from the measurement result a deviation of the wavefront of the measurement wave from a desired wavefront. In this case, the evaluation device is configured to determine an influence of an intensity distribution of the illumination radiation in the region of the mask plane on the measurement result and to take it into account when determining the deviation of the wavefront.

The intensity distribution of the illumination radiation generated by the illumination system is ascertained beforehand, in particular, and comprises a spatially resolved intensity distribution, also referred to as illumination homogeneity, and/or an angularly resolved intensity distribution, from which, in particular, the telecentricity of the illumination system can be determined.

The solution according to the invention is based on the insight that the measurement accuracy of distortion aberrations can be adversely affected by non-homogeneous mask illumination. According to the invention, the exact influence of inhomogeneities in the mask illumination on the wavefront measurement result of the measurement apparatus is ascertained from the intensity distribution of the illumination radiation in the region of the mask plane and extracted from the measurement result. A considerable improvement in the measurement accuracy with regard to distortion aberrations can thus be achieved.

In accordance with one embodiment, the evaluation device is configured to determine the influence of the intensity distribution of the illumination radiation in the region of the mask plane on the measurement result with an optical propagation calculation. The optical propagation calculation can comprise a geometric-optical calculation and/or a physical-optical calculation. The physical-optical calculation can be based on Fourier-optical models, in particular.

In accordance with a further embodiment, the measurement wave generating module comprises diffusing structures arranged in the beam path of the illumination radiation. Diffusing structures of this type serve for homogenizing the intensity distribution of the illumination radiation in the region of the mask plane. It is thus possible already to reduce the arising of distortion aberrations in the image plane. Since the remaining distortion aberrations are then only comparably slight, they can be extracted from the result for the wavefront aberration with the optical propagation calculation on the basis of the ascertained intensity distribution with an increased accuracy.

In accordance with one embodiment variant, the diffusing structures are arranged at a first side of a reticle substrate, the other side of which comprises the coherence structures. The other side is the opposite side of the reticle substrate with respect to the first side. In the case where UV light is used as illumination radiation, the diffusing structures in the form of a diffusing plate operated in transmission can be arranged at the top side (first side) of the reticle substrate. In the case where EUV radiation is used as illumination radiation, the diffusing structures can be arranged on a reflective surface layer directed into the interior of the reticle substrate and arranged at the underside (first side) of the reticle substrate, which surface layer is irradiated via a cutout of the reticle substrate and by which surface layer the coherence structures at the top side (other side) of the reticle substrate are irradiated from "the rear" i.e. from the inner region of the reticle substrate, as illustrated for example in FIG. 4 and FIG. 5 of U.S. Pat. No. 6,940,587 B2.

In accordance with a further embodiment, the measurement apparatus is configured to measure a field-point-dependent wavefront tilt aberration of the imaging optical system. In accordance with a further embodiment, the measurement apparatus is configured to measure a distortion aberration of the imaging optical system.

In accordance with a further embodiment, the measurement wave generating module comprises a focusing optical unit arranged in the beam path of the illumination radiation, for increasing the numerical aperture of the illumination. In this case, this leads to the overexposure of the pupil of the optical system; the diffusing structures can thus primarily be used for magnifying and homogenizing the illumination spot that illuminates the coherence structures. In other words, the coherence structures form an origin of the measurement wave and the focusing optical unit serves to increase the angular range of the rays emanating from the coherence structures, thus resulting in improved emission for the pupil of the optical system to be measured or overexposure of the pupil. The focusing optical unit, in the form of a spot lens element, can be secured to the top side of a reticle substrate, the underside of which comprises the coherence structures. In this case, a spacer element, e.g. in the form of a radiation-transmissive plate, can be arranged between the reticle substrate and the spot lens element. In accordance with one embodiment variant, the diffusing structures can be arranged at the focusing optical unit; by way of example, in the case where the focusing optical unit comprises a mirror, the diffusing structures can be arranged on the mirror surface.

In accordance with a further embodiment variant, the measurement wave generating module comprises a diffusing plate having diffusing structures, said diffusing plate being arranged upstream of the focusing optical unit in the beam path of the illumination radiation. A diffusing plate of this type, when arranged correctly, can bring about a very effective homogenization of the illumination spot that illuminates the coherence structures. Here in the case of a focusing optical unit operated in transmission, the diffusing plate can be arranged opposite the reticle substrate in relation to the focusing optical unit or, in the case of a reflective focusing optical unit, said diffusing plate can be arranged on the same side of the focusing optical unit as the reticle substrate. In particular, the focusing optical unit and the diffusing plate are arranged such that the diffusing plate and a reticle substrate having the coherence structures are arranged in an approximated $2f$ arrangement with respect to the imaging module, that is to say that the diffusing plate and the reticle substrate are situated in each case in opposite focal planes of the imaging module.

Furthermore, the invention provides a microlithographic projection exposure apparatus comprising a projection lens for imaging mask structures onto a wafer. This projection exposure apparatus furthermore comprises the measurement apparatus in one of the above-described embodiments or embodiment variants for measuring a wavefront aberration of the projection lens.

Furthermore, the invention provides a method for measuring a wavefront aberration of an imaging optical system. This method comprises generating a measurement wave for radiating onto the optical system by illuminating coherence structures arranged in a mask plane with an illumination radiation, and ascertaining an intensity distribution of the illumination radiation in the region of the mask plane. Furthermore, the method comprises radiating the measurement wave onto the optical system, measuring the measurement wave after passing through the optical system, determining an influence of the ascertained intensity distribution of the illumination radiation in the region of the mask plane on the measurement result, and determining a deviation of the wavefront of the measurement wave from a desired wavefront from the measurement result taking account of the determined influence of the intensity distribution in the mask plane.

Generating the measurement wave for radiating onto the optical system can be carried out with a measurement wave generating module of the type described above, and illuminating the coherence structures arranged in a mask plane with the illumination radiation can be carried out with an illumination system of the type described above. Furthermore, determining the deviation of the wavefront of the measurement wave from a desired wavefront can be carried out with an evaluation device of the type described above.

The measured intensity distribution of the illumination radiation generated by the illumination system can comprise a spatially resolved intensity distribution, also referred to as illumination homogeneity, and/or an angularly resolved intensity distribution, from which, in particular, the telecentricity of the illumination system can be determined.

In accordance with one embodiment of the method according to the invention, the influence of the ascertained intensity distribution of the illumination radiation in the region of the mask plane on the measurement result is determined with an optical propagation calculation.

In accordance with a further embodiment of the method according to the invention, diffusing structures are arranged in the beam path of the illumination radiation. In accordance with one embodiment variant, the diffusing structures are arranged at a first side of a reticle substrate, the other side of which comprises the coherence structures.

In accordance with a further embodiment, a focusing optical unit is arranged in the beam path of the illumination radiation, for increasing the numerical aperture of the illumination. In accordance with one embodiment variant, a diffusing plate comprising diffusing structures is arranged upstream of the focusing optical unit in the beam path of the illumination radiation.

In accordance with a further embodiment, the illumination radiation is generated by an illumination system and ascertaining the intensity distribution of the illumination radiation in the region of the mask plane comprises separately measuring an intensity distribution of the illumination radiation generated by the illumination system and also a diffusing distribution of the diffusing structures. A diffusing distribution of the diffusing structures should be understood to mean an angularly resolved intensity distribution of the diffused radiation generated by the diffusing structures in the case of homogeneous irradiation. The diffusing structures can be arranged on a diffusing plate. In this case, it is possible to measure the diffusing plate separately for determining the diffusing distribution. The intensity distribution of the illumination radiation in the mask plane is ascertained computationally from the measured intensity distribution of the illumination radiation generated by the illumination system and the measured diffusing distribution of the diffusing structures.

In accordance with a further embodiment, the coherence structures are arranged in a mask region of a reticle substrate. Furthermore, a focusing optical unit is arranged in the beam path of the illumination radiation, and ascertaining the intensity distribution of the illumination radiation in the region of the mask plane comprises ascertaining a position deviation of the focusing optical unit from a center of the mask region. The position deviation of the focusing optical unit corresponds to an offset of the actual position of the focusing optical unit relative to a desired position arranged in the center of the mask in projection along the direction of propagation of the illumination radiation. Ascertaining the position deviation can be carried out with a tactile measurement method. In accordance with one embodiment variant, ascertaining the illumination radiation in the mask plane is carried out computationally from the measured intensity distribution of the illumination radiation generated by the illumination system and also the ascertained position deviation of the focusing optical unit, and also, in particular, the measured diffusing distribution of the diffusing structures.

In accordance with a further embodiment, a reticle having the coherence structures is arranged in the mask plane and ascertaining the intensity distribution of the illumination radiation is carried out after interaction of the illumination radiation with the reticle. Ascertaining the intensity distribution can thus be carried out for example just below the reticle, i.e. at a location in the beam path which is disposed downstream of the reticle.

In accordance with a further embodiment, the intensity distribution in the region of the mask plane is ascertained by scanning the mask plane with an intensity measurement module comprising a microscope objective.

In accordance with a further embodiment, a projection lens integrated into a microlithographic projection exposure apparatus is used as the optical system to be measured, and ascertaining the intensity distribution in the region of the mask plane is carried out with a wavefront sensor arranged in a wafer plane of the projection exposure apparatus. In accordance with one embodiment, measuring the intensity distribution is carried out by synchronously displacing a reticle having the coherence structures in the mask plane and also a wavefront sensor in the wafer plane of the projection exposure apparatus. By deriving an intensity profile recorded over time during the displacement process, it is possible to determine the spatially resolved intensity profile in the mask plane.

The features specified with respect to the abovementioned embodiments, exemplary embodiments or embodiment variants, etc., of the measurement apparatus according to the invention can be correspondingly applied to the measurement method according to the invention, and vice versa. These and other features of the embodiments according to the invention are explained in the description of the figures and in the claims. The individual features can be implemented, either separately or in combination, as embodiments of the invention. Furthermore, they can describe advantageous embodiments which are independently protectable and protection for which is claimed if appropriate only during or after pendency of the application.

BRIEF DESCRIPTION OF THE DRAWINGS

The above and further advantageous features of the invention are illustrated in the following detailed description of exemplary embodiments according to the invention with reference to the accompanying schematic drawings. In the figures.

DETAILED DESCRIPTION

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the invention.

Figure 1:
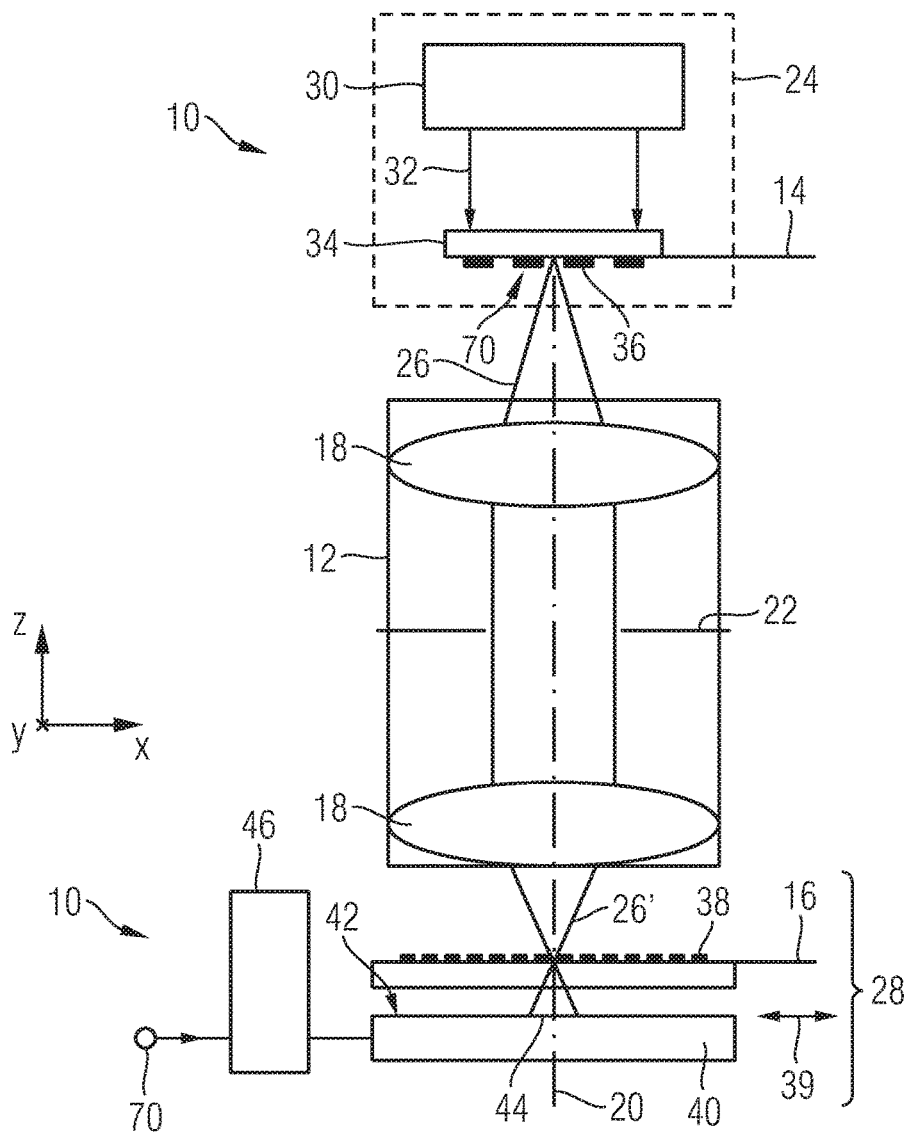
FIG. 1 shows one exemplary embodiment of a measurement apparatus according to the invention for ascertaining a wavefront aberration of an imaging optical system comprising an illumination system for generating illumination radiation and also a coherence reticle arranged in a mask plane.

In order to facilitate the description, a Cartesian xyz-coordinate system is indicated in the drawing, from which system the respective positional relationship of the components illustrated in the figures is evident. In FIG. 1, the y-direction extends perpendicularly to the plane of the drawing into said plane, the x-direction extends toward the right, and the z-direction extends upward.

FIG. 1 schematically shows a first exemplary embodiment of a measurement apparatus 10 for determining a wavefront aberration of an imaging optical system 12. The imaging optical system 12 serves to image field points of an object plane or mask plane 14 into an image plane 16 assigned to the mask plane 14 and, to this end, it comprises optical elements 18, of which only two are illustrated in FIG. 1 in an exemplary manner. Furthermore, FIG. 1 illustrates an optical axis 20 of the imaging optical system 12 parallel to the z-direction and indicates an aperture stop 22 that is arranged in a pupil plane for the purposes of delimiting a pupil. The imaging optical system 12 is conventionally embodied for imaging that is as aberration-free as possible at an operating or used wavelength or in a specific operating wavelength range. One example of such an optical imaging system is a microlithographic projection lens for imaging mask structures onto a wafer.

The imaging optical system 12 illustrated in FIG. 1 can be embodied as a projection lens operated in the UV wavelength range, in particular at approximately 365 nm, approximately 248 or approximately 193 nm. Furthermore, the imaging optical system 12 can also be embodied as a projection lens operated in the EUV wavelength range, i.e. at a wavelength of less than 100 nm, in particular a wavelength of approximately 13.5 nm or approximately 6.8 nm. In the case of a projection lens of this type, the optical elements 18 are configured as mirrors. Accordingly, the measurement apparatus 10 is configured in a suitable manner for an operating wavelength of the imaging optical system 12. In general, the measurement apparatus 10 can be embodied in a suitable manner for a wavelength from the infrared range through to the x-ray range.

Multi-channel shearing interferometry can be carried out with the measurement apparatus 10 for the purposes of determining a wavefront aberration of the imaging optical system 12. Such interferometry that is based on the principle of phase shifting is described for example in DE 101 09 929 A1. The measurement apparatus 10 comprises a measurement wave generating module 24 for generating a measurement wave 26. The measurement wave generating module 24 comprises an illumination system 30 for providing a suitable illumination radiation 32 and also a coherence reticle 34 having coherence structures 36 arranged in the region of the object plane or mask plane 14 of the imaging optical system 12. In the exemplary embodiment shown, the coherence structures 36, which are also referred to as coherence mask, are arranged at the underside of the coherence reticle.

Furthermore, the measurement apparatus 10 comprises a wavefront measurement module 28 comprising a diffractive analysis grating 38 arranged in the region of the image plane 16, a detection device 40 disposed downstream of the analysis grating 38 in the beam path and having a capture surface 42 for the spatially resolved capture of measurement radiation, and an evaluation device 46.

The illumination system 30 provides the illumination radiation 32 with a sufficient intensity and coherence for a measurement of the imaging optical system 12. In this case, the wavelength of at least part of the illumination radiation 32 corresponds to an operating wavelength of the imaging optical system 12. An illumination system of a microlithographic projection exposure apparatus 100 in accordance with FIG. 11 can be used as the illumination system 30. In particular, the measurement apparatus 10 can be completely integrated in a projection exposure apparatus 100 of this type.

The coherence structures 36 shown in FIG. 1 comprise for example a two-dimensional arrangement of pinhole stops extended in the mask plane 14. In this manner, a measurement wave 26 is in each case provided simultaneously for a plurality of field points of the mask plane 14, the respective beam path of said measurement wave also being referred to as measurement channel of the imaging optical system 12. FIG. 1 illustrates one of these measurement channels by way of example. With such a multi-channel measurement apparatus 10, it is possible simultaneously to measure imaging properties of the imaging optical system 12 for a plurality of field points through shearing interferometry. The beam path of a measurement channel is preferably configured so that the measurement wave 26 emerges from a pinhole stop in diverging fashion with a spherical wavefront and is imaged or focused onto the image plane 16 by the imaging optical system 12 to be measured. In this case, the measurement radiation, as indicated in FIG. 1, preferably illuminates or overexposes the entire pupil defined by the aperture stop 22, as explained in greater detail below. A translation module (not illustrated in FIG. 1) can be provided for the exact positioning of the coherence reticle 34. In particular, it is possible to use a reticle stage of the projection exposure apparatus as a translation module when measuring a projection lens that is integrated into a microlithographic projection exposure apparatus.

In alternative embodiments, provision can be made of only one measurement channel with a pinhole stop embodied such that it is displaceable in the mask plane 14 as coherence structures 36. Moreover, provision can be made of a plurality of pinhole stops for a measurement channel in a symmetrical two-dimensional arrangement with respect to one another and, besides circular apertures, also apertures embodied in a polygonal fashion, for instance as squares or triangles, as coherence structures 36. In respect of further possible embodiments of coherence masks or irradiation apparatuses and the description thereof, reference is made, in particular, to DE 101 09 929 A1.

The analysis grating 38 is embodied for example as a phase grating, an amplitude grating, or with some other suitable type of diffraction grating, e.g. as a grayscale grating. As a diffraction structure, the analysis grating 38 can comprise a line grating, a cross grating, a chequered grating, a triangular grating or any other suitably periodic structure. For a phase shift in the context of shearing interferometry, the analysis grating 38 can be displaced together with the detection device 40 in a translation direction 39, which is oriented substantially parallel to the x- or y-direction and hence transversely to the optical axis 20. A displacement is carried out step by step in one direction with the aid of a positioning module (not illustrated in the drawings), such as, for example, a wafer displacement stage 134 in accordance with FIG. 11 in the case of integration into a projection exposure apparatus 100.

An interferogram 44 is generated on the capture surface 42 for each measurement channel as a result of interference between radiation of the zero order of diffraction, said radiation being formed at the analysis grating 38, and radiation of a higher order of diffraction, such as the first order of diffraction, for example. There is a so-called "temporal phase shift" as a result of displacing the analysis grating 38. Here, the phase of the higher order of diffraction changes while the phase of the zero order of diffraction remains the same, as a result of which there is a change in the respective interferogram 44. In particular, the distance between two adjacent displacement positions is selected so that a phase shift that is suitable for shearing interferometry occurs between these displacement positions. Typically, the distance is a fraction of the grating period of the analysis grating 38.

The detection device 40 comprises the radiation-sensitive capture surface 42, which contains a two-dimensional arrangement of individual sensors and, for example, is embodied as a spatially resolving CCD sensor. The interferograms 44 captured by the detection device 40 are communicated to the evaluation device 46.

From the captured interferograms, the evaluation device 46 ascertains a topography of the wavefront of the emanating measurement wave 26', i.e. the measurement wave 26 after passing through the imaging optical system 12, using discrete Fourier analysis. A wavefront aberration of the imaging optical system 12 results from a deviation of the ascertained topography of the wavefront of the emanating measurement wave 26' from the predefined desired wavefront thereof.

However, such a calculation is based on the assumption that the illumination of the coherence structures 26 in the mask plane 14 is homogeneous both with regard to its spatially resolved intensity distribution and with regard to its angularly resolved intensity distribution. Non-homogeneous illumination leads to a distortion aberration in the image plane 16. By way of example, in the case of a coherence reticle 34 which serves as a planar source and in which no pupil vs. field transformation takes place, even a linear deviation of the spatially resolved homogeneity of 0.5%/mm leads to a distortion aberration of 0.25 mm. The distortion aberration can be characterized by the Zernike coefficients Z2 and Z3 of the wavefront deviation.

In order to minimize such distortion aberrations in the measurement result of the wavefront aberration, according to the invention, an intensity distribution 70 of the illumination radiation 32 in the region of the mask plane 14 is ascertained beforehand or during the wavefront measurement, as explained in greater detail below with reference to FIGS. 7 to 11. Ascertaining the intensity distribution 70 can be carried out in a spatially resolved and/or angularly resolved manner. The evaluation device 46 determines an influence of the ascertained intensity distribution 70 on the measurement result with an optical propagation calculation and takes this influence into account when determining the deviation of the wavefront of the emanating measurement wave 26' from the desired wavefront and thus when determining the wavefront aberration of the imaging optical system 12.

The optical propagation calculation is based on the knowledge of the individual optical elements 18 of the imaging optical system 12 and the arrangement of said elements in the beam path. In this case, the optical propagation calculation can comprise geometric-optical or physical-optical calculations. The geometric-optical calculations involve calculating the propagation of the measurement wave through the individual optical elements 18 of the imaging optical system 12 using rays to model or to generate the measurement wave 26. The physical-optical calculation involves diffraction calculations and can be based on Fourier-optical models, in particular. The diffraction calculations may be represented by an equation of $d=1/n$, where N is a number of groves per unit length. D is a grating spacing and $\theta$ is angle of diffraction.

In accordance with one exemplary embodiment according to the invention, the measurement wave generating module 24 comprises diffusing structures 48 arranged upstream of the mask plane 14 in the beam path of the illumination radiation 32, said diffusing structures serving for homogenizing the intensity distribution 70 of the illumination radiation in the region of the mask plane 14. This measure already reduces the arising of distortion aberrations in the image plane 16 to a minimum. Since the remaining distortion aberrations are then only comparably slight, they can be extracted from the result for the wavefront aberration with the optical propagation calculation on the basis of the ascertained intensity distribution 70 with a high accuracy.

FIGS. 2 to 6 show embodiments for the abovementioned exemplary embodiment of the measurement wave generating module 24 in which diffusing structures 48 serving for homogenization are provided. In this case, FIGS. 2 to 4 relate to embodiments for the use of visible or UV light as illumination radiation 32 and FIGS. 5 and 6 relate to embodiments for the use of EUV radiation.

Figure 2:
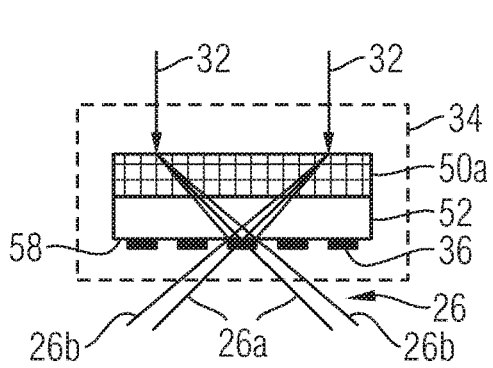
FIG. 2 shows one exemplary embodiment of the coherence reticle in accordance with FIG. 1 with a diffusing plate.

In the embodiment in accordance with FIG. 2, the diffusing structures are part of the coherence reticle 34, specifically in the form of a diffusing plate 50a arranged above a reticle substrate 52 comprising the coherence structures 36. The diffusing structures 48 are thus arranged at a top side 58 of the reticle substrate 52 and the coherence structures 36 are arranged at the underside 56 of said reticle substrate. The diffusing structures 48 serve firstly the expand the measurement wave 26 emanating from the coherence structures 36. In FIG. 2, the measurement wave expanded relative to the measurement wave 26a generated without the presence of diffusing structures 48 is designated by the reference sign 26b. The expanded measurement wave 26b overexposes the pupil delimited by the aperture stop 22 and, in comparison with the measurement wave 26a, brings about a homogenization of the pupil illumination and thus accordingly a homogenization of the angularly resolved intensity distribution in the mask plane 14. Furthermore, the diffusing structures 48 magnify the illumination spot in the mask plane 14, thereby bringing about a homogenization of the spatially resolved intensity distribution in the mask plane 14.

Figure 3:
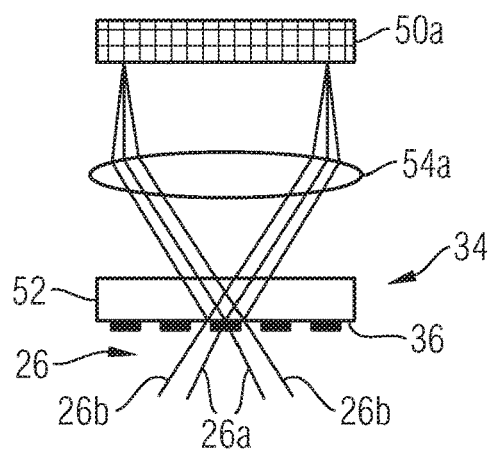
FIG. 3 shows an arrangement comprising a diffusing plate, a focusing optical unit and also a reticle substrate for positioning in the region of the mask plane in accordance with FIG. 1.

In the embodiment shown in FIG. 3, a focusing optical unit 54a in the form of a spot lens element and also a diffusing plate 50a are disposed upstream of the reticle substrate 52 having the coherence structures 36. This is a 2f arrangement, that is to say that the diffusing plate 50a and the coherence structures 36 are arranged on different sides of the focusing optical unit 54a in each case at a distance of approximately a focal length f of the focusing optical unit 54a. Like the arrangement in accordance with FIG. 2, this arrangement serves firstly to expand the measurement wave 26 emanating from the coherence structures 36 and also to magnify the illumination spot in the mask plane 14 and thus to homogenize both the spatially resolved and the angularly resolved intensity distribution in the mask plane 14. In the case of multi-channel transmission of radiation in the imaging optical system 12, an arrangement in accordance with FIG. 3 contains a focusing optical unit 54a in the form of a spot lens element for each radiation channel.

The entire arrangement illustrated in FIG. 3, comprising the diffusing plate 50a, the focusing optical unit(s) 54 and also the reticle substrate 52 having the coherence structures 36, can be completely integrated into the coherence reticle 34, as illustrated in the embodiment variant in accordance with FIG. 4 explained below. Alternatively, the reticle substrate 52 having the coherence structures 36 can form the coherence reticle 34 in accordance with FIG. 1, in which case the diffusing plate 50a and the focusing optical unit(s) 54 are arranged upstream of the coherence reticle 34, e.g. as part of the illumination system 30.

As mentioned above, FIG. 4 shows one embodiment variant in which all the elements in accordance with FIG. 3 are arranged within the coherence reticle 34. The latter is also referred to below as "spot lens element reticle". In this embodiment variant, the focusing optical unit 54a, in the form of the spot lens element, is secured to the top side 58 of the reticle substrate 52 with a spacer element 55. The diffusing plate 50*a* is secured to the reticle substrate 52 at an appropriate distance from the focusing optical unit 54*a* with support structures 57.

Figure 5:
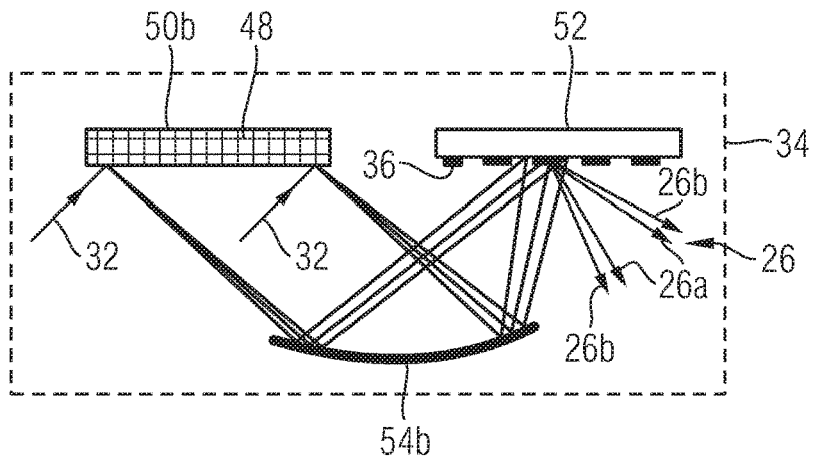
FIG. 5 shows one exemplary embodiment of the coherence reticle in accordance with FIG. 1 in the case where the measurement apparatus is embodied for operation with EUV radiation.

FIG. 5 illustrates a variant corresponding to the embodiment in accordance with FIG. 3 for EUV radiation as illumination radiation 32. A 2f arrangement is involved here as well. The diffusing structures 48 are arranged at the surface of a diffusing plate in the form of a plane diffusing mirror 50*b*. After reflection at the diffusing mirror 50*b*, the illumination radiation 32 is focused using a focusing mirror 54*b* onto that surface of the reticle substrate 52 which has the coherence structures 36, which surface is embodied as a mirror in said reticle substrate.

Like the arrangement in accordance with FIG. 3, the arrangement in accordance with FIG. 5 serves to expand the measurement wave 26 emanating from the coherence structures 36 and also to magnify the illumination spot in the mask plane 14 and thus to homogenize both the spatially resolved and the angularly resolved intensity distribution in the mask plane 14. The entire arrangement illustrated in FIG. 5, comprising the diffusing mirror 50*b* and the focusing mirror 54*b* or a plurality of focusing mirrors 54*b* and also the reticle substrate 52 having the coherence structures 36, can be completely integrated into the coherence reticle 34. Alternatively, the reticle substrate 52 having the coherence structures 36 can form the coherence reticle 34 in accordance with FIG. 1, in which case the diffusing mirror 50*b* and the focusing mirror(s) 54*b* are arranged upstream of the coherence reticle 34, e.g. as part of the illumination system 30.

Figure 6:
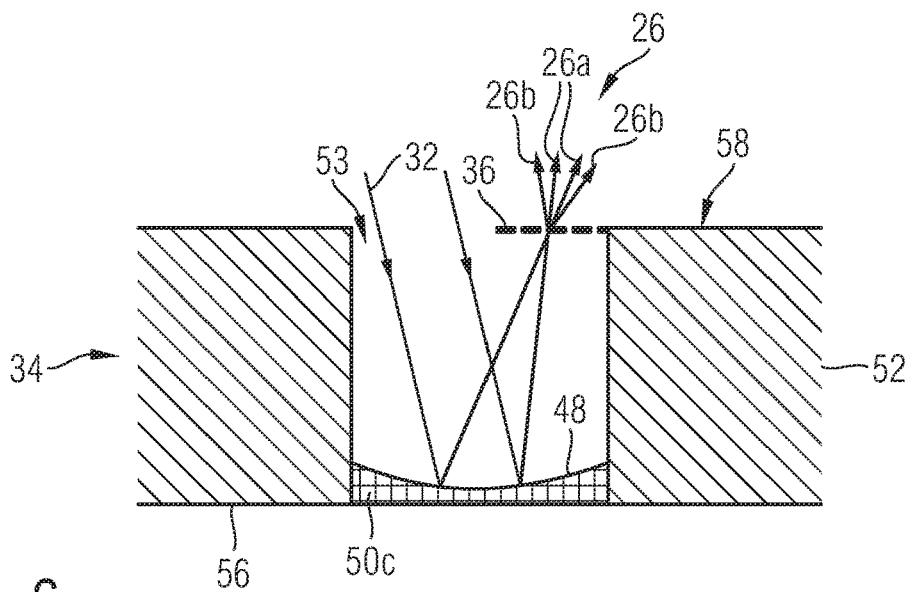
FIG. 6 shows a further exemplary embodiment of the coherence reticle in accordance with FIG. 1 in the case where the measurement apparatus is embodied for operation with EUV radiation.

FIG. 6 illustrates a further embodiment of a coherence reticle 34 for use with EUV radiation. In this embodiment, the diffusing structures 48 are arranged at the surface of a focusing diffusing mirror 50*c*. The latter is situated at the underside 56 of a reticle substrate 52 having, in the region of the diffusing mirror 50*c*, a cavity 53 that is open toward the top side 58 of the reticle substrate 52. The illumination radiation 32 is radiated onto the focusing diffusing mirror 50*c* via the cavity 53, which mirror focuses said illumination radiation onto a mask having the coherence structures 36, said mask being arranged at the top side 58 of the reticle substrate 52.

Like the arrangement in accordance with FIG. 5, the coherence reticle 34 in accordance with FIG. 6 serves to expand the measurement wave 26 emanating from the coherence structures 36 and also to magnify the illumination spot in the mask plane 14 and thus to homogenize both the spatially resolved and the angularly resolved intensity distribution in the mask plane 14.

FIGS. 7 to 11 illustrate various embodiments for determining the intensity distribution 70 of the illumination radiation 32 in the region of the mask plane 14. As mentioned above, determining the intensity distribution can be carried out in a spatially resolved and/or angularly resolved manner.

Figure 7:
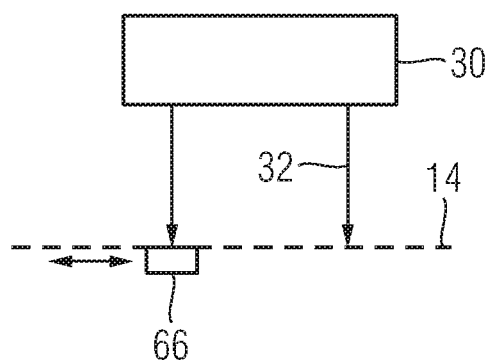
FIG. 7 shows a measurement arrangement for measuring a spatially resolved intensity distribution of the illumination radiation in the mask plane in accordance with FIG. 1.
Figure 8:
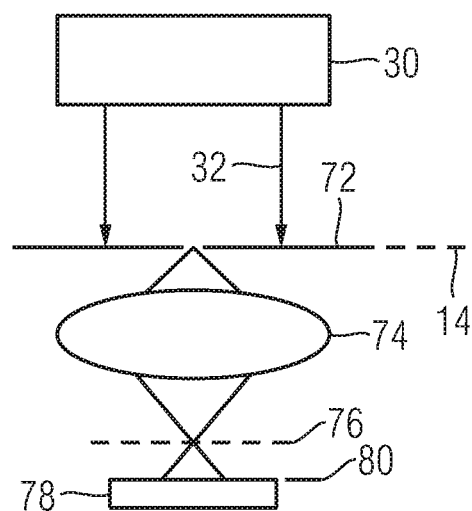
FIG. 8 shows a measurement arrangement for measuring an angularly resolved intensity distribution of the illumination radiation in the mask plane in accordance with FIG. 1.
Figure 9:
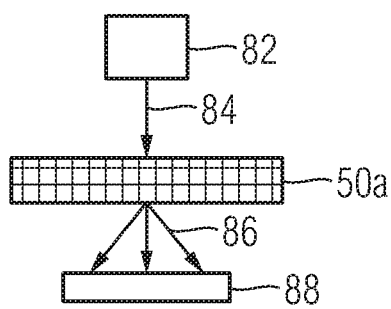
FIG. 9 shows a measurement arrangement for measuring a diffusing distribution of the diffusing plate in accordance with FIG. 2.

In accordance with a first embodiment illustrated in FIGS. 7 to 9, to that end, firstly the illumination system 30 is measured separately, that is to say that the intensity distribution of the illumination radiation 32 is measured without arrangement of the coherence reticle 34 in the mask plane 14. In this case, the spatially resolved component and the angularly resolved component of the intensity distribution can be measured separately.

The spatially resolved component, also referred to as "uniformity", can be measured by scanning the mask plane 14 using an intensity sensor 66, which can be embodied as a point sensor, as illustrated in FIG. 7. The angularly resolved component can be recorded with the arrangement shown in FIG. 8. This arrangement comprises a pinhole stop 72 arranged in the mask plane 14, an imaging optical unit 74, and also a spatially resolving intensity sensor 78 arranged below the image plane 76 of the imaging optical unit 74, in particular in a pupil plane 80 of the imaging optical unit 74. In particular, the telecentricity of the illumination system 30 can be determined from the angularly resolved component of the intensity distribution.

Figure 4:
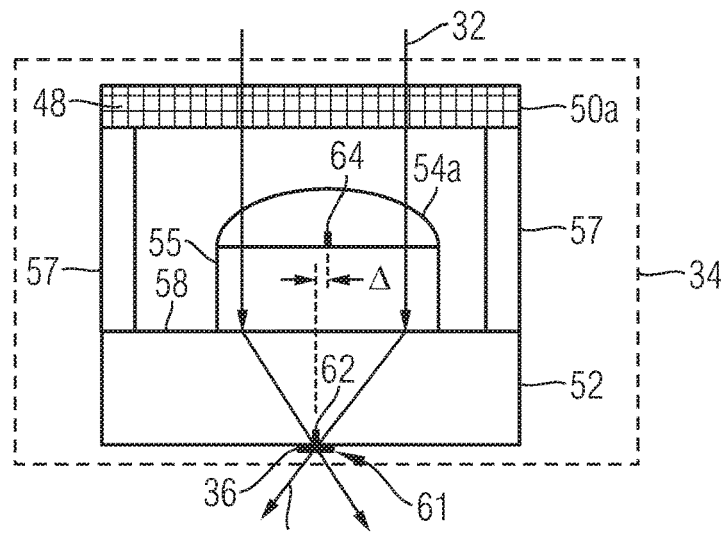
FIG. 4 shows one exemplary embodiment of a configuration of the arrangement in accordance with FIG. 3 as a coherence reticle in accordance with FIG. 1.

Furthermore, in accordance with the first embodiment, the diffusing distribution of the diffusing plate 50*a* in accordance with FIG. 2, 3 or 4, of the diffusing mirror 50*b* in accordance with FIG. 5 or of the diffusing mirror 50*c* in accordance with FIG. 6 is measured separately, as illustrated on the basis of the diffusing plate 50*a* in FIG. 9. In this case, the diffusing plate 50*a* is irradiated with an illumination ray generated by an illumination source 82 and the diffused radiation 86 generated in transmission is recorded with a spatially resolving intensity sensor 88. Furthermore, with the use of the coherence reticle 34 in accordance with FIG. 4, it is furthermore possible to ascertain a position deviation Δ of a lens element center 64 of the focusing optical unit 54*a* from a center 62 of a mask region 61 having the coherence structures, said mask region being assigned to the focusing optical unit 54*a*, e.g. using a tactile measurement method.

The combination of the measurement results of the arrangements from FIGS. 7, 8 and 9 and also, if appropriate, the measurement result of the position deviation Δ yields the intensity distribution 70 that is fed to the evaluation device 46 of the measurement apparatus 10 in accordance with FIG. 1. As an alternative to measuring the position deviation Δ of the focusing optical unit from the desired position thereof, the coherence reticle 34 in accordance with FIG. 4 can be calibrated by rotation in steps of 90° and respective measurement in the different rotational positions.

Figure 10:
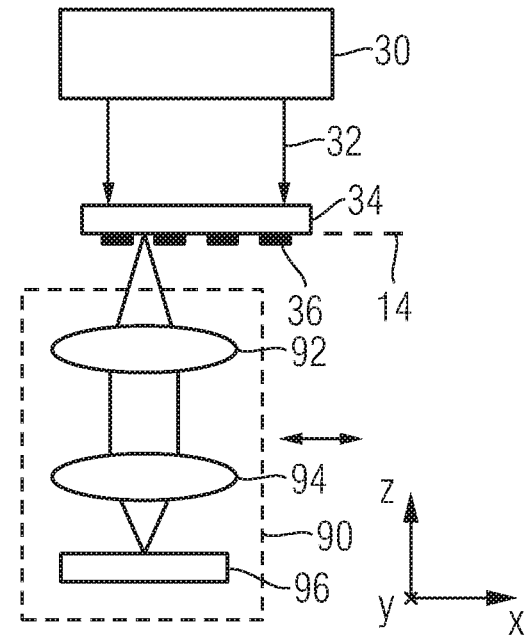
FIG. 10 shows a measurement arrangement for measuring an intensity distribution of the illumination radiation just below the coherence reticle in accordance with FIG. 1.

In accordance with a further embodiment for ascertaining the intensity distribution 70, as illustrated in FIG. 10, the illumination system 30 together with the coherence reticle 34 having the diffusing structures 48 is measured by scanning the mask plane 14 with an intensity measurement module 90. To that end, in accordance with one embodiment variant, the imaging optical system 12 is demounted from the measurement apparatus 10 or, in the case where the measurement apparatus 10 is integrated into a microlithographic projection exposure apparatus, from the projection exposure apparatus in order to make space for the intensity measurement module 90. The latter comprises a microscope objective 92, a tube optical unit 94 and an intensity sensor 96. By displacing the intensity measurement module 90 in the x-y-plane, it is possible to measure the intensity distribution 70 of the illumination radiation 32 in the region just below the coherence reticle 34.

Figure 11:
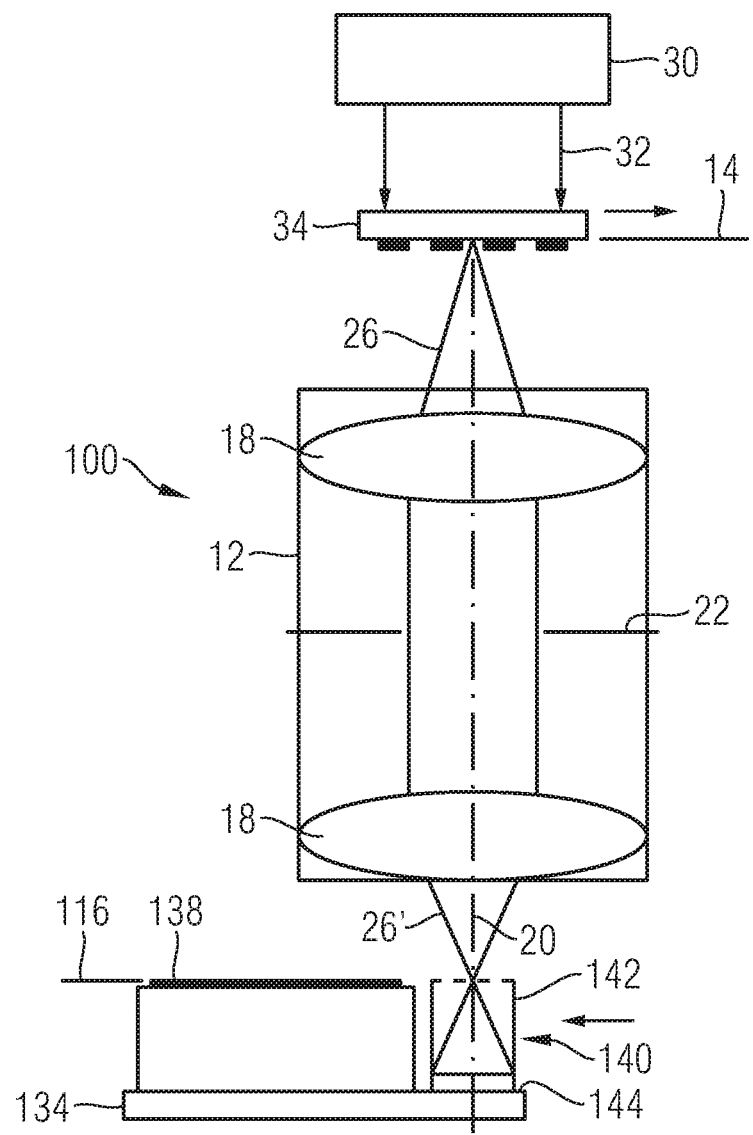
FIG. 11 shows a measurement arrangement for measuring the spatially resolved intensity distribution of the illumination radiation just below the coherence reticle, said measurement arrangement being integrated into a microlithographic projection exposure apparatus.

In accordance with the embodiment illustrated in FIG. 11, ascertaining the intensity distribution 70 is carried out within a microlithographic projection exposure apparatus 100 into which the measurement apparatus 10 in accordance with FIG. 1 is integrated. The projection exposure apparatus 100 is configured as a step-and-scan exposure apparatus. In wafer exposure operation, a product reticle is arranged in the mask plane 14 and is displaced in the opposite direction to, or in the same direction as, a wafer 138 arranged on a wafer displacement stage 134, transversely to the optical axis 20 of the projection lens in the form of the imaging optical system 12. In this case, the product reticle is illuminated by the illumination system 30. For wavefront aberration measurement of the imaging optical system 12, the product reticle is replaced by the coherence reticle 34 and a region of the wafer displacement stage 134, which region is not illustrated in the drawings and in which region the analysis grating 38 and the detection device 40 in accordance with FIG. 1 are arranged, is moved into the beam path of the emanating measurement wave 26'.

In order to ascertain the intensity distribution 70, the coherence reticle 34 is likewise loaded into the mask plane 14 and a wavefront sensor 140 arranged on the wafer displacement stage 134 is arranged in the beam path of the emanating measurement wave 26'. In accordance with one embodiment of the wavefront sensor 140, the latter comprises a diffraction grating 142 arranged in the wafer plate 116, and also a spatially resolving intensity sensor 144 arranged below the diffraction grating 142. The wavefront sensor 140 can also be configured differently; in particular, it can be embodied in accordance with one of the variants shown in FIGS. 15, 17 and 18 of DE 101 09 929 A1.

In accordance with one embodiment, measuring the spatially resolved intensity distribution 70 of the illumination radiation 32 in the region of the mask plane 14 is carried out by displacing synchronously, in opposite directions, the coherence reticle 34 in the mask plane 14 and the wavefront sensor 140 in the wafer plane 116 in fractions of the structure size of the measurement pattern of the coherence structures 36. In this case, the intensity sensor 144 records the intensity integrated over the size of the measurement pattern. In this case, integration is effected over the entire detection area of the intensity sensor 144. The spatially resolved intensity distribution in the region of the mask plane is ascertained by deriving the recorded intensity function. This distribution is preferably also corrected with the previously ascertained apodization function of the imaging optical system 12 and the likewise previously ascertained transmission function of the coherence reticle 34 and of the wavefront sensor 140.

The above description of exemplary embodiments is to be understood to be by way of example. The disclosure effected thereby firstly enables the person skilled in the art to understand the present invention and the advantages associated therewith, and secondly encompasses alterations and modifications of the described structures and methods that would be apparent to the person skilled in the art. Therefore, all aspects of the present invention, including such alterations and modifications, fall within the scope of the invention, as defined by the accompanying claims, and equivalents thereof.

LIST OF REFERENCE SIGNS

10 Measurement apparatus
12 Imaging optical system
14 Mask plane
16 Image plane
18 Optical element
20 Optical axis
22 Aperture stop
24 Measurement wave generating module
26 Measurement wave
26' Emanating measurement wave
26a Measurement wave without diffusing structures
26b Expanded measurement wave
28 Wavefront measurement module
30 Illumination system
32 Illumination radiation
34 Coherence reticle
36 Coherence structures
38 Analysis grating
39 Translation direction
40 Detection device
42 Capture surface
44 Interferogram
46 Evaluation device
48 Diffusing structures
50a Diffusing plate
50b Plane diffusing mirror
50c Curved diffusing mirror
52 Reticle substrate
53 Cavity
54a, 54b Focusing optical unit
55 Spacer element
56 Underside
57 Supporting structures
58 Top side
60 Spacer element
61 Mask region
62 Mask center
64 Lens element center
66 Intensity sensor
70 Intensity distribution
72 Pinhole stop
74 Imaging optical unit
76 Image plane
78 Intensity sensor
80 Pupil plane
82 Illumination source
84 Illumination ray
86 Diffused radiation
88 Intensity sensor
90 Intensity measurement module
92 Microscope objective
94 Tube optical unit
96 Intensity sensor
100 Projection exposure apparatus
116 Wafer plane
134 Wafer displacement stage
138 Wafer
140 Wavefront sensor
142 Diffraction grating
144 Intensity sensor

What is claimed is:

1. A measurement apparatus for measuring a wavefront aberration of an imaging optical system comprising:
a measurement wave generating module configured to generate a measurement wave radiated onto the optical system, wherein the measurement wave generating module comprises:
an illumination system configured to illuminate a mask plane with an illumination radiation, and
coherence structures arranged in the mask plane, and
a wavefront measurement module configured to determine a measurement result after the measurement wave passes through the optical system and, with an evaluation device, to determine, from the measurement result, a deviation of the wavefront of the measurement wave from a desired wavefront,
wherein the evaluation device is configured to determine, based on an optical propagation calculation, an extent of an influence of an intensity distribution of the illumination radiation in a region of the mask plane on the measurement result and to determine the deviation of the wavefront of the measurement wave in accordance with the determined extent of the influence of the intensity distribution, and wherein the optical propagation calculation involves at least one of:
calculating a propagation of a measurement wave through individual optical elements of the imaging optical system using rays to model the measurement wave, or
calculating the propagation of the measurement wave through the individual optical elements of the imaging optical system using diffraction calculations, and
wherein the optical propagation calculation is based on characteristics of individual optical elements of the imaging optical system and an arrangement of the optical elements in a beam path of the measurement wave through the imaging optical system.

2. The measurement apparatus as claimed in claim 1, wherein the measurement wave generating module comprises diffusing structures arranged in the beam path of the illumination radiation.

3. The measurement apparatus as claimed in claim 2, wherein the diffusing structures are arranged at a first side of a reticle substrate, and wherein a second side of the reticle substrate comprises the coherence structures.

4. The measurement apparatus as claimed in claim 1, which is configured to measure a field-point-dependent wavefront tilt aberration of the imaging optical system.

5. The measurement apparatus as claimed in claim 1, which is configured to measure a distortion aberration of the imaging optical system.

6. The measurement apparatus as claimed in claim 1, wherein the measurement wave generating module comprises a focusing optical unit arranged in the beam path of the illumination radiation.

7. The measurement apparatus as claimed in claim 6, wherein the measurement wave generating module comprises a diffusing plate having diffusing structures, said diffusing plate being arranged upstream of the focusing optical unit in the beam path of the illumination radiation.

8. A microlithographic projection exposure apparatus, comprising a projection lens for imaging mask structures onto a wafer, and a measurement apparatus as claimed in claim 1 for measuring a wavefront aberration of the projection lens.

9. A method for measuring a wavefront aberration of an imaging optical system, comprising:
generating a measurement wave for radiating onto the optical system by illuminating coherence structures arranged in a mask plane with an illumination radiation,
ascertaining an intensity distribution of the illumination radiation in a region of the mask plane, and
radiating the measurement wave onto the optical system, measuring the measurement wave after the measurement wave passes through the optical system, determining, based on performing an optical propagation calculation, an extent of an influence of the ascertained intensity distribution of the illumination radiation in the region of the mask plane on the measurement result, and determining a deviation of the wavefront of the measurement wave from a desired wavefront based on the measurement result including the determined extent of the influence of the ascertained intensity distribution in the mask plane,
wherein the optical propagation calculation involves at least one of:
calculating a propagation of a measurement wave through individual optical elements of the imaging optical system using rays to model the measurement wave, or
calculating the propagation of the measurement wave through the individual optical elements of the imaging optical system using diffraction calculations, and
wherein the optical propagation calculation is based on characteristics of individual optical elements of the imaging optical system and an arrangement of the optical elements in a beam path of the measurement wave through the imaging optical system.

10. The method as claimed in claim 9, further comprising arranging diffusing structures in the beam path of the illumination radiation.

11. The method as claimed in claim 10, wherein the diffusing structures are arranged at a first side of a reticle substrate, and wherein a second side of the reticle substrate comprises the coherence structures.

12. The method as claimed in claim 9, further comprising arranging a focusing optical unit in the beam path of the illumination radiation.

13. The method as claimed in claim 12, further comprising arranging a diffusing plate comprising diffusing structures upstream of the focusing optical unit in the beam path of the illumination radiation.

14. The method as claimed in claim 10, further comprising:
generating the illumination radiation with an illumination system,
wherein said ascertaining of the intensity distribution of the illumination radiation in the region of the mask plane comprises separately measuring an intensity distribution of the illumination radiation generated by the illumination system, and measuring a diffusing distribution of the diffusing structures.

15. The method as claimed in claim 9, further comprising arranging a focusing optical unit in the beam path of the illumination radiation,
wherein the coherence structures are arranged in a mask region of a reticle substrate, and
wherein said ascertaining of the intensity distribution of the illumination radiation in the region of the mask plane comprises ascertaining a position deviation of the focusing optical unit from a center of the mask region.

16. The method as claimed in claim 9, further comprising arranging a reticle having the coherence structures in the mask plane,
wherein said ascertaining of the intensity distribution of the illumination radiation is carried out after interaction of the illumination radiation with the reticle.

17. The method as claimed in claim 9, wherein said ascertaining of the intensity distribution in the region of the mask plane comprises scanning the mask plane with an intensity measurement module comprising a microscope objective.

18. The method as claimed in claim 9,
wherein the imaging optical system comprises a projection lens integrated into a microlithographic projection exposure apparatus, and
wherein said ascertaining of the intensity distribution in the region of the mask plane comprises arranging a wavefront sensor in a wafer plane of the projection exposure apparatus.

19. The method as claimed in claim 9, further comprising:
measuring a spatially resolved component and an angularly resolved component of the intensity distribution of the illumination radiation separately to obtain measurement results and, using the measurement results, determining the extent of the influence of the ascertained intensity distribution of the illumination radiation in the region of a mask plane on the measurement results of the wavefront aberration.

20. The method of claim 9, wherein the optical propagation calculation includes a physical-optical calculation based on at least one Fourier-optical model.

21. The measurement apparatus as claimed in claim 1, wherein the intensity distribution of the illumination radiation in the region of a mask plane includes a spatially resolved component and an angularly resolve component, measured separately.

* * * * *